(12) United States Patent
Nakano et al.

(10) Patent No.: US 9,918,394 B2
(45) Date of Patent: Mar. 13, 2018

(54) ROBOT CONTROL APPARATUS

(71) Applicant: Seiko Epson Corporation, Tokyo (JP)

(72) Inventors: Sho Nakano, Matsumoto (JP); Ryosuke Teranaka, Matsumoto (JP)

(73) Assignee: Seiko Epson Corporation (JP)

( * ) Notice: Subject to any disclaimer, the term of this patent is extended or adjusted under 35 U.S.C. 154(b) by 54 days.

(21) Appl. No.: 14/962,406

(22) Filed: Dec. 8, 2015

(65) Prior Publication Data

US 2016/0174400 A1    Jun. 16, 2016

(30) Foreign Application Priority Data

Dec. 12, 2014  (JP) .................. 2014-251597
Dec. 12, 2014  (JP) .................. 2014-251598

(51) Int. Cl.
*H05K 5/00* (2006.01)
*H05K 7/14* (2006.01)

(52) U.S. Cl.
CPC ......... *H05K 5/0017* (2013.01); *H05K 7/1467* (2013.01)

(58) Field of Classification Search
CPC .......................... H05K 5/0017; H05K 7/1467
See application file for complete search history.

(56) References Cited

U.S. PATENT DOCUMENTS

| | | | | |
|---|---|---|---|---|
| 4,845,992 A * | 7/1989 | Dean | ............... | F01D 9/041 |
| | | | | 29/889.22 |
| 4,964,018 A * | 10/1990 | Mallory | ............ | H04B 1/08 |
| | | | | 248/917 |
| 5,790,401 A * | 8/1998 | Shields | ............ | G05B 19/427 |
| | | | | 318/568.11 |
| 6,643,126 B2 * | 11/2003 | Su | .................... | G06F 1/206 |
| | | | | 361/679.33 |
| 7,254,015 B2 * | 8/2007 | Yin | ................ | G06F 1/1616 |
| | | | | 361/679.55 |
| 2004/0031060 A1 * | 2/2004 | Kondo | ........... | G06Q 50/188 |
| | | | | 725/131 |
| 2006/0250320 A1 * | 11/2006 | Fuller | ............. | G06F 1/1616 |
| | | | | 345/1.1 |
| 2009/0129003 A1 * | 5/2009 | Bruck | ............. | G08C 17/02 |
| | | | | 361/679.4 |
| 2010/0026912 A1 * | 2/2010 | Ho | ................... | H04N 5/64 |
| | | | | 348/836 |

FOREIGN PATENT DOCUMENTS

JP    2010-064230 A    3/2010
JP    2011-194480 A    10/2011

* cited by examiner

*Primary Examiner* — Dimary Lopez Cruz
*Assistant Examiner* — Abhishek Rathod
(74) *Attorney, Agent, or Firm* — Harness, Dickey & Pierce, P.L.C.

(57) ABSTRACT

A robot system includes a robot and a robot control apparatus. The robot control apparatus is connected to the robot for controlling the robot and includes a casing and a display unit movable with respect to the casing and displaying information. The casing has a plurality of attachment parts to which the display unit is attached. The plurality of attachment parts are provided on first and second surfaces of the casing, and the first surface is not parallel to the second surface.

4 Claims, 6 Drawing Sheets

ROBOT CONTROL APPARATUS

BACKGROUND

1. Technical Field

The present invention relates to a robot control apparatus.

2. Related Art

In related art, robot control apparatuses installed outside of robots are known. For example, Patent Document 1 (JP-A-2010-64230) discloses a robot control apparatus having a casing in a nearly rectangular parallelepiped shape and a maintenance display unit indicating ON or OFF power state and being rotatable with respect to the casing. The robot control apparatus disclosed in Patent Document 1 may change an installation position of the casing in response to an installation environment without reduction of visibility of information displayed on the maintenance display unit by rotating the maintenance display unit.

Further, for example, Patent Document 2 (JP-A-2011-194480) discloses a robot control apparatus having a casing in a nearly rectangular parallelepiped shape and many operation objects including a cable connector provided on one rectangular flat surface.

For operation of the robot control apparatus, it is preferable that a display unit is provided on the front surface of the robot control apparatus as seen from an operator. Although it is necessary to install the robot control apparatus near the robot, the installation environment varies. Accordingly, a robot control apparatus that flexibly changes the installation method according to the installation environment is desired.

Further, for insertion and removal of a cable to and from the robot control apparatus and operation of switches of the robot control apparatus, it is preferable that cable connectors and switches as the operation objects are provided on the front surface of the robot control apparatus as seen from the operator.

SUMMARY (1) A robot control apparatus according to an aspect of the invention is a robot control apparatus connected to a robot for controlling the robot including a casing and a display unit movable with respect to the casing and displaying information.

Here, the display unit may display information on the robot or the robot control apparatus including a status, a command, an error code and may be e.g. a dot matrix display or an indicator that displays information by a lighting state of a lamp such as an LED.

According to the aspect of the invention, the display unit is movable with respect to the casing, and the installation method may be flexibly changed.

(2) A robot control apparatus according to an aspect of the invention is a robot control apparatus for controlling a robot including a casing and a plurality of fixing parts provided in the casing and selected according to an installation object on which the casing is installed, wherein each of the plurality of fixing parts can fix a holding member attached to the installation object and holding the casing.

Here, the installation object refers to an object on which the casing of the robot control apparatus is installed such as a table, a rack, a ceiling, a wall, or a pillar. According to the aspect of the invention, the plurality of fixing parts are provided in the casing, and thereby, the fixing part corresponding to the installation object may be selected, the holding member may be fixed to the selected fixing part, and the holding member may be attached to the installation object. Thus, according to the aspect of the invention, the installation method may be flexibly changed according to the installation environment.

(3) In the robot control apparatus, a plurality of operation objects are provided and all of the plurality of operation objects may be provided on one surface of the casing.

Here, the operation object refers to an object to be moved, to which a cable is connected, and to and from which a removable memory is inserted and removed, and includes e.g. a switch, a connector, and a removable memory slot in order to use the robot. According to the aspect of the invention, the installation method may be flexibly changed because it is necessary to prevent only the surface on which the operation objects are provided from facing closer to the surface of the installation object. Further, the operation of the operation objects provided on one surface is easier.

(4) In the robot control apparatus, the operation objects may include a power switch and a cable connector.

(5) In the robot control apparatus, the installation object may include a wall and a pillar.

(6) In the robot control apparatus, the holding member may include a first holding member attached to the first installation object and a second holding member attached to the second installation object, and the first holding member and the second holding member may be different.

(7) In the robot control apparatus, the holding member can be attached to the first installation object and the second installation object.

(8) In the robot control apparatus, the holding member may be provided with a handle.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be explained with reference to the accompanying drawings. In the respective drawings, the same signs are assigned to corresponding component elements and the overlapping explanation will be omitted.

1. Outline

Figure 1A:
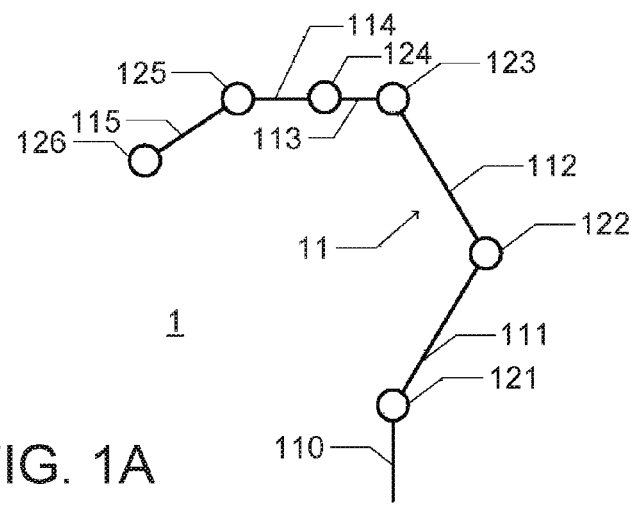
FIG. 1A is a schematic diagram according to an embodiment of the invention.
Figure 1B:
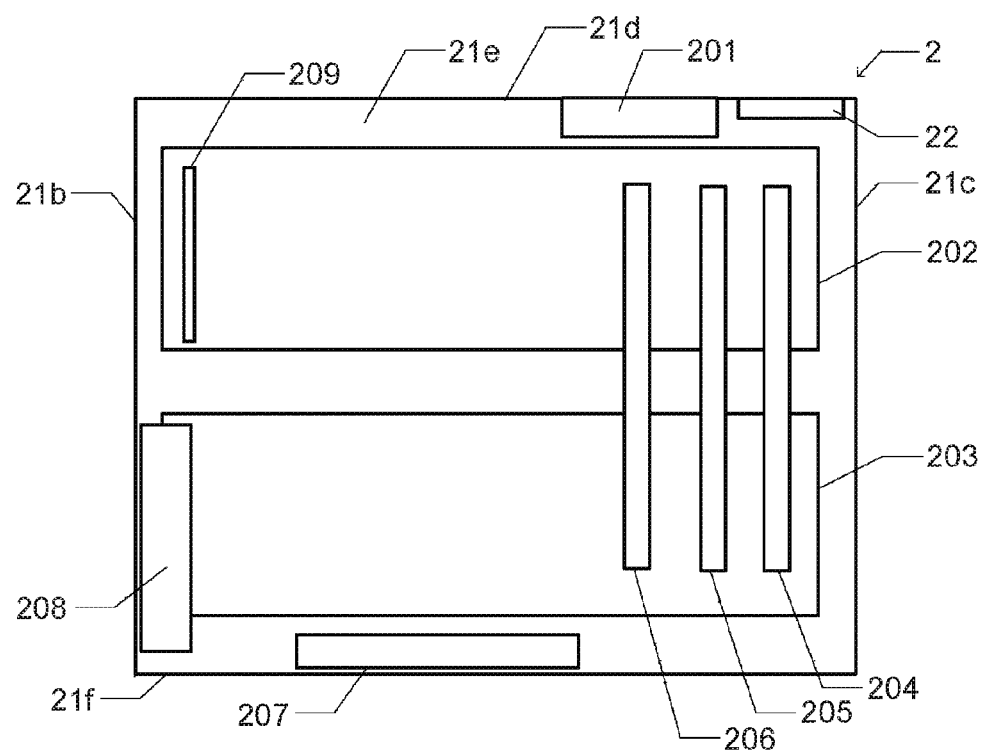
FIG. 1B is a schematic plan view according to the embodiment of the invention.
Figure 2A:
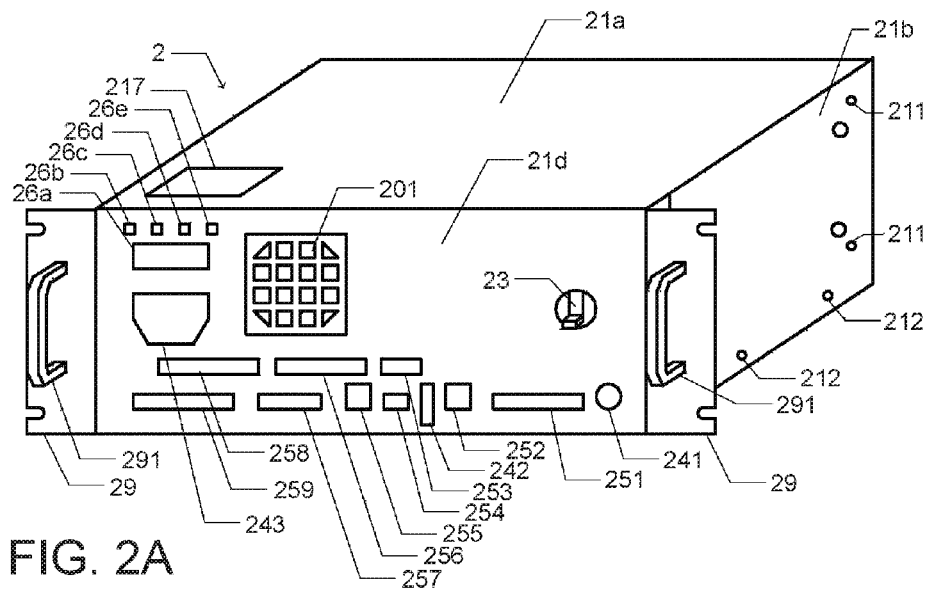
FIGS. 2A and 2B are perspective views according to the embodiment of the invention.
Figure 2B:
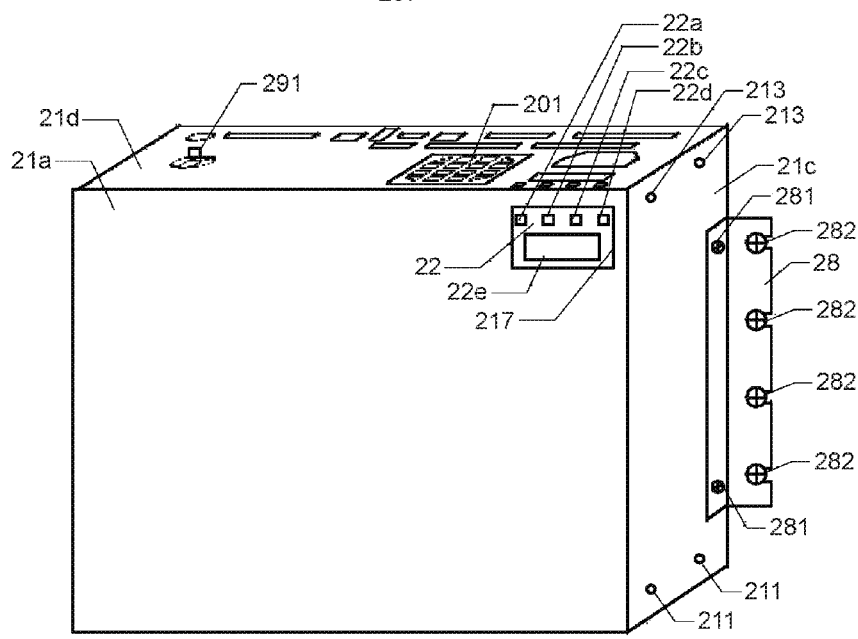

FIGS. 1B, 2A, and 2B show a robot control apparatus 2 as one embodiment of the invention. The robot control apparatus 2 is an apparatus installed outside of a robot 1 shown in FIG. 1A, supplying power to the robot 1, and controlling the robot 1. The robot 1 includes a base part 110, arms 111, 112, 113, 114, 115, and motors (not shown) that rotate rotation shaft members 121, 122, 123, 124, 125, 126.

As shown in FIGS. 1B, 2A, and 2B, the robot control apparatus 2 includes a rectangular parallelepiped casing 21. The casing 21 includes a top plate 21a, a side plate 21b, a side plate 21c, a front plate 21d, a bottom plate 21e, and a rear plate 21f respectively in flat plate shapes.

FIG. 1B is a plan view when the top plate 21a of the casing 21 is detached. The casing 21 houses a display unit 22, a cooling fan 201, a control board 202, a drive power board 203, motor drive units 204, 205, 206, a regeneration resistance unit 207, a switching power unit 208, an option board 209, etc. The cooling fan 201 is fixed to the front plate 21d. The control board 202 and the drive power board 203 are fixed to the bottom plate 21e. The motor drive units 204, 205, 206 are fixed to the control board 202 and the drive power board 203. The regeneration resistance unit 207 is fixed to the rear plate 21f. The switching power unit 208 is fixed to the drive power board 203. The option board 209 is fixed to the control board 202. The motor drive unit 204 supplies power to the motors for rotating the rotation shaft members 125, 126. The motor drive unit 205 supplies power to the motors for rotating the rotation shaft members 123, 124. The motor drive unit 206 supplies power to the motors for rotating the rotation shaft members 121, 122. On the control board 202, a processor, a main memory, an external memory, an input/output mechanism, etc. are provided. The processor executes a control program stored in the external memory, and thereby, outputs a control signal to the drive power board 203 to control the robot 1 and displays status information of the robot 1 and the robot control apparatus 2 on the display unit 22.

As shown in FIGS. 2A and 2B, all of a power switch 23, a power cable connector 241, communication cable connectors 251 to 259, a removable memory slot 242, and a control cable connector 243 as operation objects are provided on the front plate 21d. A power cable for connecting an external alternating-current power source and the robot control apparatus 2 is connected to the power cable connector 241. Communication cables for connecting the robot control apparatus 2 to a PC (Personal Computer) for instruction to the robot 1, a communication network, an emergency stop switch, etc. are connected to the communication cable connectors 251 to 259. A control cable for supplying power and transmitting various control signals and various sensor signals to the robot 1 is connected to the control cable connector 243.

Figure 3A:
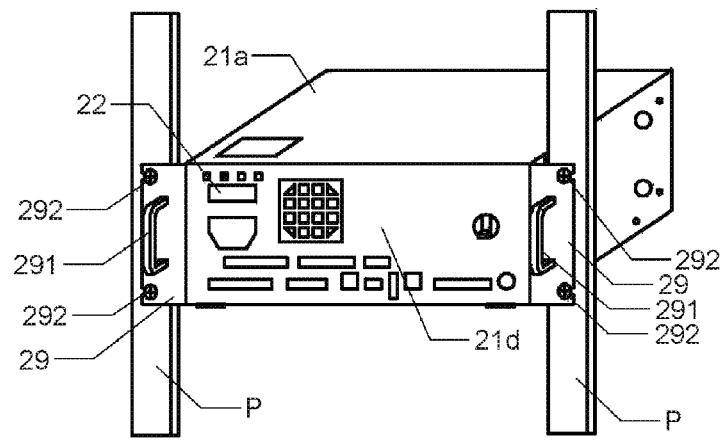
FIGS. 3A to 3C are perspective views according to the embodiment of the invention.
Figure 3B:
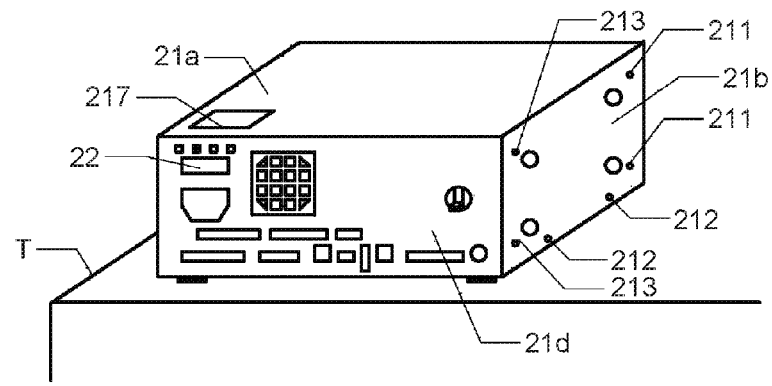
Figure 3C:
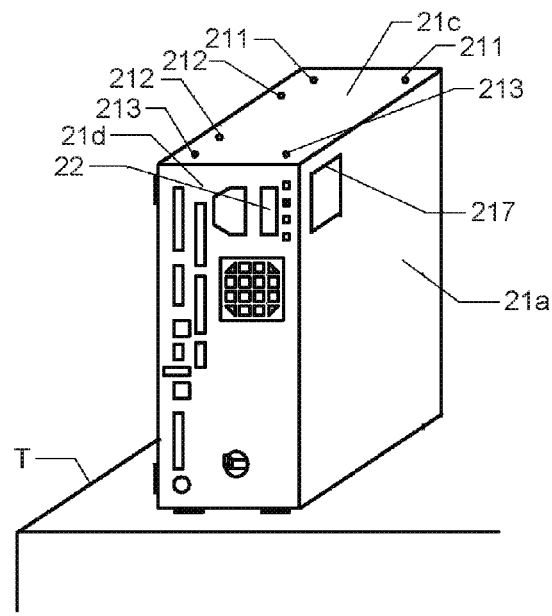
Figure 4A:
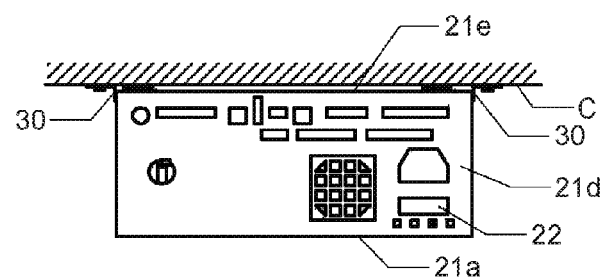
FIGS. 4A and 4B are front views according to the embodiment of the invention.
Figure 4B:
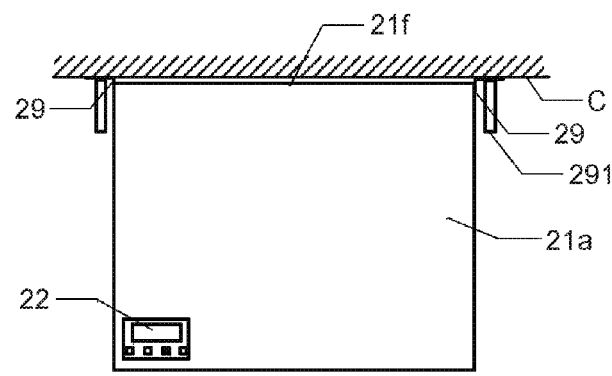
Figure 4C:
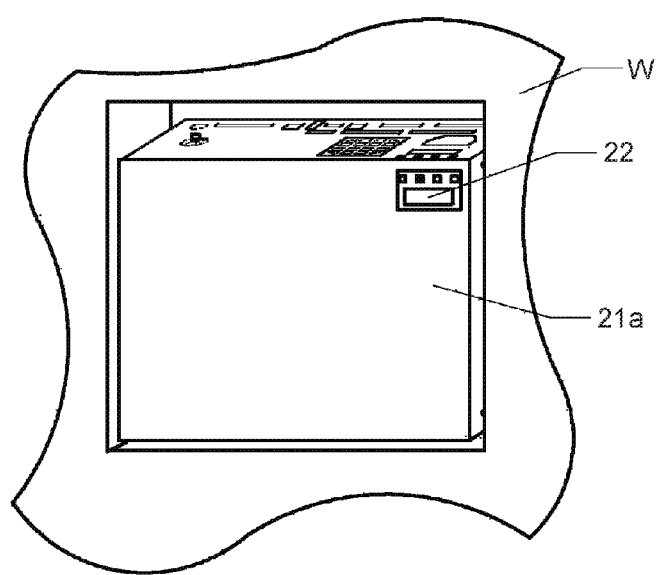
FIG. 4C is a perspective view according to the embodiment of the invention.

Since all of the power switch 23, the power cable connector 241, the communication cable connectors 251 to 259, the removable memory slot 242, and the control cable connector 243 as the operation objects are provided on the front plate 21d, the robot control apparatus 2 may flexibly changes the installation method according to the installation environment. That is, as shown in FIG. 3A, the apparatus may be installed on pillars P in a position with the bottom plate 21e at the downside and the front plate 21d in parallel to the vertical direction. As shown in FIG. 3B, the apparatus may be installed on a table T in a position with the bottom plate 21e at the downside and the front plate 21d in parallel to the vertical direction. As shown in FIG. 3C, the apparatus may be installed on the table T in a position with the side plate 21b at the downside and the top plate 21a in parallel to the vertical direction. As shown in FIG. 3C, the apparatus may be installed on the table T in a position with the side plate 21b at the downside and the front plate 21d in parallel to the vertical direction. As shown in FIG. 4A, the apparatus may be installed on a ceiling C with the top plate 21a at the downside and the front plate 21d in parallel to the vertical direction. As shown in FIG. 4B, the apparatus may be installed on the ceiling C with the front plate 21d at the downside and the top plate 21a in parallel to the vertical direction. As shown in FIG. 4C, the apparatus may be installed in a recessed part of a wall W with the rear plate 21f at the downside and the top plate 21a in parallel to the vertical direction. Further, in whichever form the casing 21 is installed, various cables may be connected to the connectors 241, 251 to 259, 243, a removable memory may be inserted into the removable memory slot 242, and the power switch 23 may be operated.

The display unit 22 may be attached to either the front plate 21d or the top plate 21a. Therefore, the display unit 22 may be attached to either the front plate 21d or the top plate 21a more easily to be seen in response to the height at which the robot control apparatus 2 is installed and the installation position of the robot control apparatus 2. Further, for example, when the robot control apparatus 2 is installed in the recessed part of the wall as shown in FIG. 4C, the display unit 22 is attached to the top plate 21a so that the display unit 22 may not hide behind the surrounding wall and cables.

2. Configuration

As shown in FIGS. 3B and 3C, screw holes 213 as a first attachment part, screw holes 212 as a second attachment part, and screw holes 211 as a third attachment part are respectively provided in the opposed side plate 21b and side plate 21C. The first attachment part is selected when the casing 21 is installed on the pillars P as shown FIG. 3A and includes the two screw holes 213 provided in the side plate 21b and the two screw holes 213 provided in the side plate 21c. The second attachment part is selected when the casing 21 is installed on the wall W as shown in FIG. 4C and includes the two screw holes 212 provided in the side plate 21b and the two screw holes 212 provided in the side plate 21c. The third attachment part is selected when the casing 21 is installed on the ceiling C as shown in FIG. 4A and includes the two screw holes 211 provided in the side plate 21b and the two screw holes 211 provided in the side plate 21c.

Figure 5A:
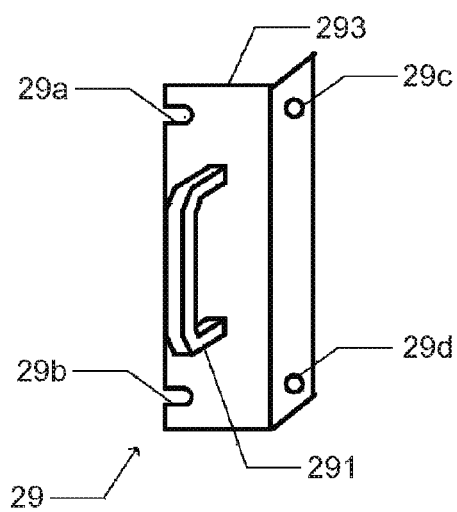
FIGS. 5A and 5B are perspective views according to the embodiment of the invention.

A first holding member 29 shown in FIG. 5A can be fixed to the screw holes 213 as the first attachment part and the screw holes 211 as the third attachment part with screws. The first holding member 29 includes a metal plate 293 bent in an L-shape and a handle 291. In the metal plate 293, screw holes 29c, 29d corresponding to the screw holes 213 and screw holes 29a, 29b corresponding to the screw holes formed in the pillars P as installation objects are formed. As shown in FIG. 2A or 4B, the two first holding members 29 are respectively fixed to the side plate 21b and the side plate 21c with screws, and thereby, the robot control apparatus 2 may be supported with both hands holding the handles 291. Or, as shown in FIG. 3A, the two first holding members 29 are attached to the two pillars P with screws 292, and thereby, the casing 21 may be held between the two pillars P by the two first holding members 29. Or, as shown in FIG. 4B, the two first holding members 29 are attached to the ceiling C with screws, and thereby, the casing 21 may be suspended and held from the ceiling C by the first holding members 29.

Figure 5B:
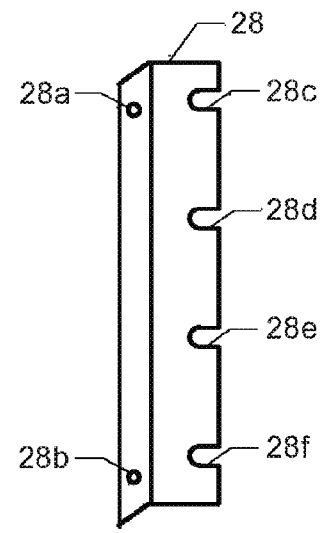

A second holding member 28 shown in FIG. 5B can be fixed to the screw holes 212 as the second attachment part with screws. The second holding member 28 is formed by a metal plate bent in an L-shape, and screw holes 28a, 28b corresponding to the screw holes 212 and screw holes 28c, 28d, 28e, 28f corresponding to the screw holes formed in the wall W as an installation object are formed. As shown in FIG. 2B, the two second holding members 28 are respectively fixed to the side plate 21b and the side plate 21c with screws 281 and the second holding members 28 are attached to the wall W with screws 282, and thereby, the casing 21 may be suspended and held from the wall W by the second holding members 28. The two second holding members 28 are respectively fixed to the side plate 21b and the side plate 21c with the screws 281 and the second holding members 28 are attached to the ceiling C with screws as shown in FIG. 4C, and thereby, the casing 21 may be suspended and held from the ceiling C by the second holding members 28.

As described above, one of the first attachment part, the second attachment part, and the third attachment part may be selected according to the installation object and the first holding members 29 or the second holding members 28 may be fixed to the selected attachment part, and thereby, the robot control apparatus 2 may be installed on various installation objects including the wall W, the ceiling C, and the pillars P.

Figure 5C:
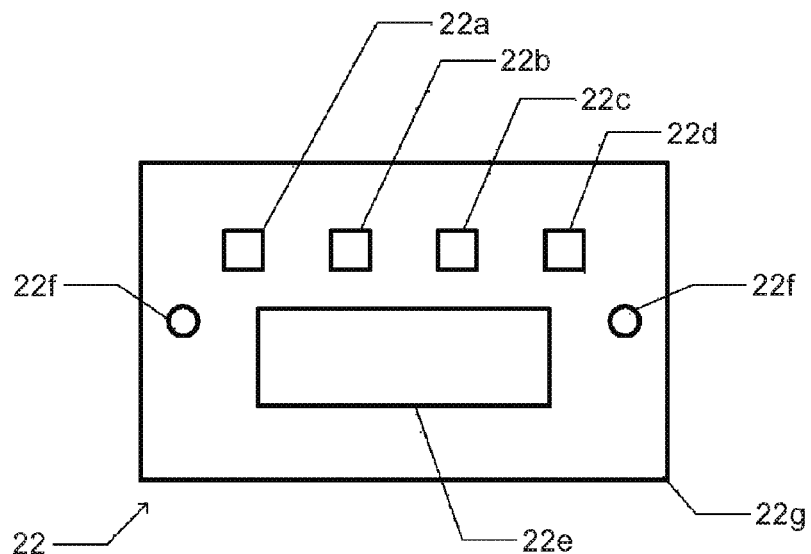
FIG. 5C is a plan view according to the embodiment of the invention.

As shown in FIG. 5C, the display unit 22 includes a dot matrix display 22e, lamps 22a, 22b, 22c, 22d, and a board 22g. The lamps 22a, 22b, 22c, 22d include LEDs as light sources and indicate ON or OFF power state, error or normal state, etc. by lighting and extinction. The dot matrix display 22e displays an operation mode of the robot 1 and an error code of the robot 1 and the robot control apparatus 2. The lamps 22a, 22b, 22c, 22d and the dot matrix display 22e are fixed to the board 22g. Holes 22f are provided in the board 22g.

As shown in FIG. 2A, as a first attachment part of the display unit 22, an opening 26a for exposure of the dot matrix display 22e and openings 26b, 26c, 26d, 26e for exposure of the lamps 22a, 22b, 22c, 22d are formed in the front plate 21d of the casing 21, and screw holes (not shown) are provided on the back side of the front plate 21d. As shown in FIG. 2B, as a second attachment part of the display unit 22, an opening 217 for exposure of the dot matrix display 22e and the lamps 22a, 22b, 22c, 22d are formed in the top plate 21a of the casing 21, and screw holes (not shown) are provided on the back side of the top plate 21a. The display unit 22 may be attached to one of the first attachment part and the second attachment part according to the installation method of the casing 21 and a lid closing the opening may be attached to the other.

For example, when the front plate 21d is in front of the operator as shown in FIGS. 3A, 3B, 3C, and 4A, the display unit 22 may be attached to the first attachment part provided in the front plate 21d. Or, when the top plate 21a is in front of the operator as shown in FIGS. 4B and 4C, the display unit 22 may be attached to the second attachment part provided in the top plate 21a. Further, for the cases where the front plate 21d is at the downside as shown in FIG. 4B and where the front plate 21d is at the upside as shown in FIG. 4C, screw holes may be provided for attachment of the display unit 22 in a reverse orientation with respect to the second attachment part.

3. Other Embodiments

The technical scope of the invention is not limited to the above described examples. Obviously, various changes may be made without departing from the scope of the invention.

Figure 6A:
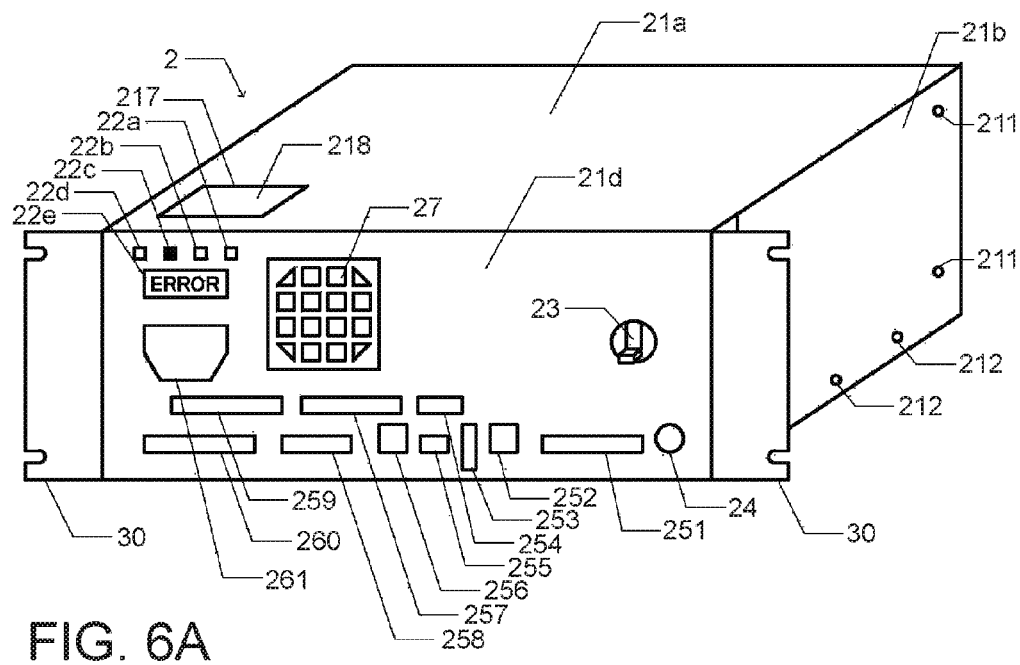
FIGS. 6A and 6B are perspective views according to the embodiment of the invention.
Figure 6B:
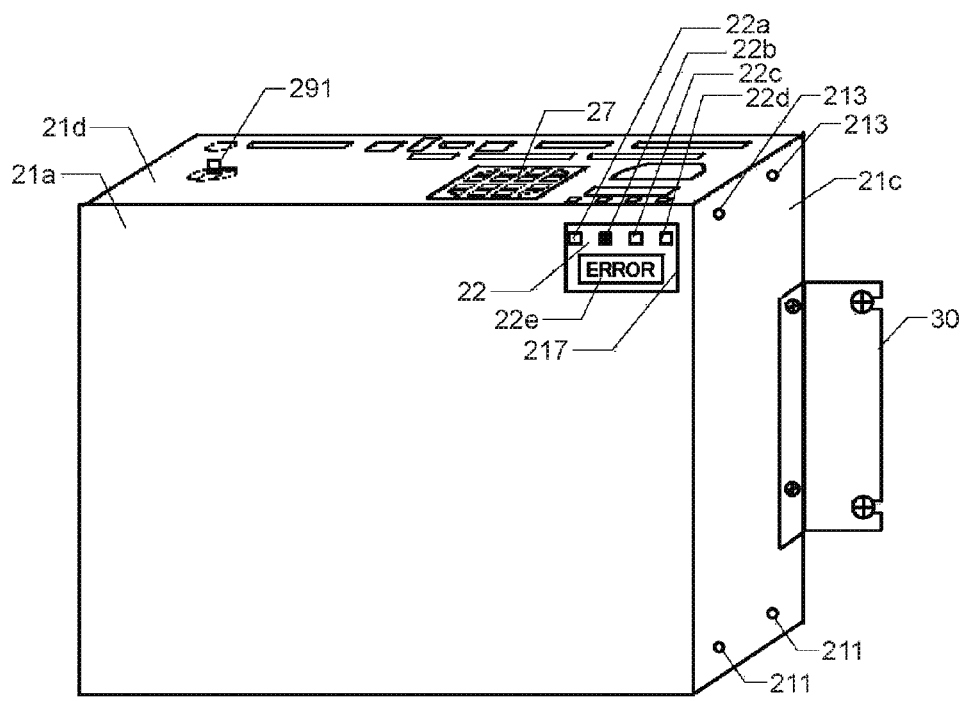

For example, the holding members for fixing the casing of the robot control apparatus to the installation objects may vary in shape for each installation object, or are common shared members that can be attached to all installation objects. Specifically, as shown in FIGS. 6A and 6B, the casing 21 may be fixed to pillars, a wall, and a ceiling using holding members 30 as shared members.

The method of fixing the holding members and the casing is not limited to the screws, but includes a combination of holes and projections. The method of fixing the holding members and the installation object is not limited to the screws, but includes a combination of holes and projections. That is, the fixing parts for fixing the holding members are not limited to the screw holes, but include holes and projections. Further, the number of fixing parts for fixing the holding members may be two or more, e.g. two or four or more.

The display unit may be adapted to be movable with respect to the casing, and the unit may be attached inside or outside of the casing. When the display unit is adapted to be attached outside of the casing, the opening of the casing for exposure of the display unit is unnecessary. Specifically, the display unit may be adapted to be attached to an arbitrary area of the outer surface of the casing, and a through hole for passing a cable for connecting the display unit and the circuit within the casing may be formed in the casing. According to the configuration, the display unit may be attached to an arbitrary area of the casing in an arbitrary orientation. Or, the display unit may be adapted to be installed apart from the casing. For example, cable connectors for connecting the display unit and the circuit within the casing may be respectively provided in the display unit and the casing so that the display unit and the casing may be connected by a cable having an arbitrary length. Further, when the opening for exposure of the display unit is provided in the casing, the opening may be formed in any of the top plate, the front plate, the side plate, the bottom plate, and the rear plate in any number of locations.

The entire disclosure of Japanese Patent Application Nos. 2014-251598, filed Dec. 12, 2014 and 2014-251597, filed Dec. 12, 2014 are expressly incorporated by reference herein.

What is claimed is:

1. A robot system comprising:
   a robot having a base and arms connectedly provided on the base; and
   a robot control apparatus that is connected to the robot, the control apparatus being configured to control the robot and provide power to the robot, the robot control apparatus including:
   a casing having a plurality of attachment parts; and
   a display unit movable with respect to the casing and displaying information,
   wherein the display unit is attached to one of the plurality of attachment parts, and
   the plurality of attachment parts are provided on first and second surfaces of the casing, and the first surface is not parallel to the second surface.

2. The robot system according to claim 1,
   wherein each of the plurality of attachment parts has an opening through which the displayed information on the display unit is viewable, and
   the display unit is attached inside of the casing.

3. The robot system according to claim 1, further comprising a plurality of operation objects,
   wherein all of the plurality of operation objects are provided on one surface of the casing, and one of the plurality of attachment parts is provided on the one surface on which the plurality of operation objects are provided.

4. The robot system according to claim 1, wherein the casing is a rectangular parallelepiped.

* * * * *